(12) United States Patent
Chen et al.

(10) Patent No.: US 7,852,976 B2
(45) Date of Patent: Dec. 14, 2010

(54) BIDIRECTIONAL CONTROLLING DEVICE FOR INCREASING RESISTANCE OF ELEMENTS ON VOLTAGE STRESS

(75) Inventors: Chen-Ming Chen, Hsin-Chu (TW); Kuang-Hsiang Liu, Hsin-Chu (TW); Sheng-Chao Liu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 23 days.

(21) Appl. No.: 12/135,220

(22) Filed: Jun. 9, 2008

(65) Prior Publication Data
US 2009/0206909 A1   Aug. 20, 2009

(30) Foreign Application Priority Data
Feb. 14, 2008   (TW) ............................... 97105167 A (51) Int. Cl.
*G11C 19/00* (2006.01)
(52) U.S. Cl. .......................... 377/64; 377/69; 327/391; 327/427

(58) Field of Classification Search ................. None
See application file for complete search history.

(56) References Cited

U.S. PATENT DOCUMENTS

| 5,194,765 | A  | * | 3/1993 | Dunlop et al. | ................. 326/87 |
| 5,243,229 | A  | * | 9/1993 | Gabara et al. | ................. 307/98 |
| 5,282,234 | A  | * | 1/1994 | Murayama et al. | ............ 377/69 |
| 6,418,182 | B1 | * | 7/2002 | Suyama et al. | ................. 377/69 |
| 6,778,626 | B2 | * | 8/2004 | Yu | ................................ 377/69 |
| 7,327,343 | B2 | * | 2/2008 | Lu et al. | ..................... 345/100 |

FOREIGN PATENT DOCUMENTS

JP        401228214    *   9/1989   .................. 327/261

* cited by examiner

*Primary Examiner*—Tuan Lam
(74) *Attorney, Agent, or Firm*—Winston Hsu; Scott Margo (57) ABSTRACT

A bidirectional controlling device is utilized for receiving two input signals, which are respectively provided from a first input terminal and a second input terminal, and for respectively providing two output signals to a first output terminal and a second output terminal, by controlling a plurality of switch sets.

14 Claims, 13 Drawing Sheets

BIDIRECTIONAL CONTROLLING DEVICE FOR INCREASING RESISTANCE OF ELEMENTS ON VOLTAGE STRESS

BACKGROUND OF THE INVENTION

1. Field of the Invention

The present invention relates to a bidirectional controlling device, and more particularly, to a bidirectional controlling device for increasing resistance of elements on voltage stress.

2. Description of the Prior Art

In specifications of a conventional thin-film transistor liquid crystal display (TFT LCD) having a medium or small size, there are requirements of bidirectional scanning. While low temperature poly-silicon (LTPS) or amorphous silicon (a-Si) are utilized for fabricating thin-film transistors (TFTs), and when a gate driving circuit is formed on a glass substrate, for meeting the requirements of bidirectional scanning, a bidirectional circuit has to be added in the gate driving circuit for controlling a direction of scanning signals.

Figure 1:
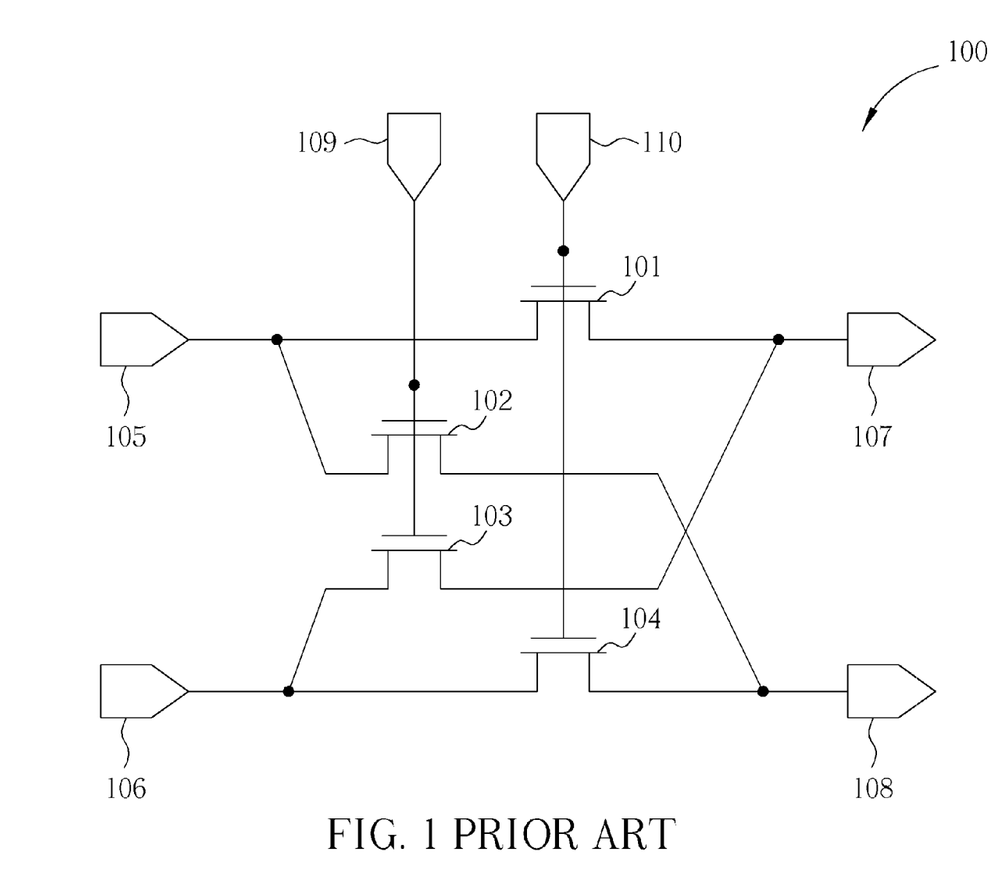
FIG. 1 illustrates a bidirectional controlling device conventionally used in a gate driving circuit.

FIG. 1 illustrates a bidirectional controlling device conventionally used in a gate driving circuit. A bidirectional controlling device 100 includes a first gate input terminal 109, a second gate input terminal 110, a first thin film transistor (TFT) 101, a second TFT 102, a third TFT 103, a fourth TFT 104, a first input terminal 105, a second input terminal 106, a first output terminal 107, and a second output terminal 108. Note that the TFTs in the bidirectional controlling device 100 are switches.

In the bidirectional controlling device 100, the first gate input terminal 109 and the second gate input terminal 110 outputs two DC signals having mutually-opposite polarities. Assume the first gate input terminal 109 provides an input signal XBi, and assume the second gate input terminal 110 provides an input signal Bi. When the input signal Bi from the second gate input terminal 110 receives a high voltage level, the input signal XBi from the first gate input terminal 109 receives a low voltage level. At this time, since an input signal of the first input terminal 105 is transmitted to the first output terminal 107 through the first TFT 101, and since an input signal of the second input terminal 106 is transmitted to the second output terminal 108 through the fourth TFT 104, an operation of the bidirectional controlling device 100 may be called forward scanning. On the contrary, when the input signal Bi from the second gate input terminal 110 receives a low voltage level, the input signal XBi from the first gate input terminal 109 receives a high voltage level. At this time, since the input signal of the first input terminal 105 is transmitted to the second output terminal 108 through the second TFT 102, and since the input signal of the second input terminal 106 is transmitted to the first output terminal 107 through the third TFT 103, the operation of the bidirectional controlling device 100 may be called reverse scanning.

In the bidirectional controlling device 100, bidirectional controlling signals for controlling the direction of scanning, i.e., the input signal XBi provided by the first gate input terminal 109 and the input signal Bi provided by the second gate input terminal 110, are DC signals, and are directly inputted to gates of TFTs of the bidirectional controlling device 100. Under conventional circumstances, when the bidirectional controlling device 100 is implemented with a-Si, shifts of threshold voltages of a-Si-based elements interfere significantly with a control mechanism of the bidirectional controlling device 100. Due to the DC voltage stress on the a-Si-based elements, the threshold voltage shifts are easily generated on the a-Si-based elements. In other words, the threshold voltages exceed predicted degrees so that conducting currents are significantly reduced.

SUMMARY OF THE INVENTION

The present invention discloses a bidirectional controlling device for receiving input signals from a first input terminal and a second input terminal, and providing two output signals to a first output terminal and a second output terminal. The disclosed bidirectional controlling device comprises a first switch set, a second switch set, a third switch set, and a fourth switch set. The first switch set comprises a plurality of switches connected in parallel. The first switch set has an input terminal coupled to the first input terminal, and an output terminal coupled to the first output terminal. The second switch set comprises a plurality of switches connected in parallel. The second switch set has an input terminal coupled to the first input terminal, and an output terminal coupled to the second output terminal. The third switch set comprises a plurality of switches connected in parallel. The third switch set has an input terminal coupled to the second input terminal, and an output terminal coupled to the first output terminal. The fourth switch set comprises a plurality of switches connected in parallel. The fourth switch set has an input terminal coupled to the second input terminal, and an output terminal coupled to the second output terminal. Each of the first switch set, the second switch set, the third switch set, and the fourth switch set comprises a same number of switches.

The claimed invention discloses a bidirectional controlling device utilized for shift registers. The bidirectional controlling device comprises a first shift register, a second shift register, a third shift register, a first switch set, a second switch set, a third switch set, and a fourth switch set. Each of the first shift register, the second shift register, and the third shift register, has a first input terminal, a second input terminal, and an output terminal. The first switch set comprises a plurality of switches connected in parallel. The first switch set has an input terminal coupled to the output terminal of the first shift register, and an output terminal coupled to the first input terminal of the third shift register. The second switch set comprises a plurality of switches connected in parallel. The second switch set has an input terminal coupled to the output terminal of the first shift register, and an output terminal coupled to the second input terminal of the third shift register. The third switch set comprises a plurality of switches connected in parallel. The third switch set has an input terminal coupled to the output terminal of the second shift register, and an output terminal coupled to the first input terminal of the third shift register. The fourth switch set comprises a plurality of switches connected in parallel. The fourth switch set has an input terminal coupled to the output terminal of the second shift register, and an output terminal coupled to the second input terminal of the third shift register. Each of the first switch set, the second switch set, the third switch set, and the fourth switch set comprises a same number of switches.

These and other objectives of the present invention will no doubt become apparent to those of ordinary skill in the art after reading the following detailed description of the preferred embodiment that is illustrated in the various figures and drawings.

DETAILED DESCRIPTION

Figure 2:
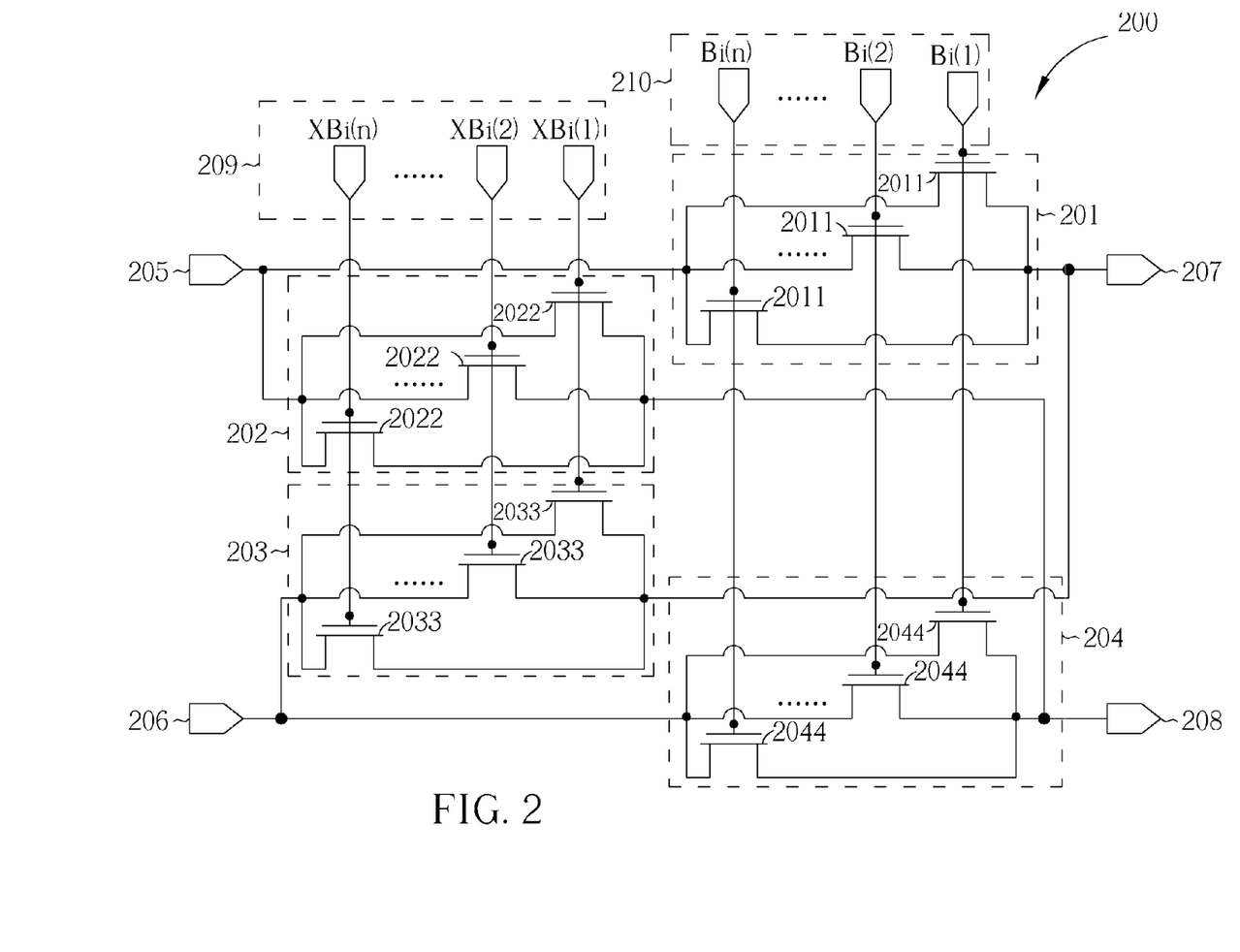
FIG. 2 illustrates a bidirectional controlling device implemented with N-type TFTs, according to one embodiment of the present invention.

FIG. 2 illustrates a bidirectional controlling device implemented with N-type TFTs and disclosed in the present invention. Note that the N-type TFTs in the bidirectional controlling device illustrated in FIG. 2 function as switches. The bidirectional controlling device 200 is used for receiving two input signals respectively provided by a first input terminal 205 and a second input terminal 206, and for respectively providing an output signal to a first output terminal 207 and to a second output signal 208. In the prefer embodiment, the bidirectional controlling device 200 includes a first N-type TFT set 201, a second N-type TFT set 202, a third N-type TFT set 203, and a fourth N-type TFT set 204. The first N-type TFT set 201 includes a plurality of N-type TFTs 2011 connected in parallel. Each N-type TFT 2011 has a source coupled to an input terminal of the first N-type TFT set 201, and a drain coupled to an output terminal of the first N-type TFT set 201. Note that in this embodiment, the source of the N-type TFT 2011 is regarded as a first terminal of said N-type TFT 2011, and the drain of the N-type TFT 2011 is regarded as a second terminal of said N-type TFT 2011 as well. The first input terminal 205 is coupled to the input terminal of the first N-type TFT set 201. The first output terminal 207 is coupled to the output terminal of the first N-type TFT set 201. The second N-type TFT set 202 includes a plurality of N-type TFTs 2022 connected in parallel. Each N-type TFT 2022 has a source coupled to an input terminal of the second N-type TFT set 202, and a drain coupled to an output terminal of the second N-type TFT set 202. Note that in this embodiment, the source of the N-type TFT 2022 is regarded as a first terminal of said N-type TFT 2022, and the drain of the N-type TFT 2022 is regarded as a second terminal of said N-type TFT 2022. The first input terminal 205 is coupled to the input terminal of the second N-type TFT set 202. The second output terminal 208 is coupled to the output terminal of the second N-type TFT set 202. The third N-type TFT set 203 includes a plurality of N-type TFTs 2033 connected in parallel. Each N-type TFT 2033 has a source coupled to an input terminal of the third N-type TFT set 203, and a drain coupled to an output terminal of the third N-type TFT set 203. Note that in this embodiment, the source of the N-type TFT 2033 is regarded as a first terminal of said N-type TFT 2033, and the drain of the N-type TFT 2033 is regarded as a second terminal of said N-type TFT 2033. The first output terminal 207 is coupled to the output terminal of the third TFT set 203. The second input terminal 206 is coupled to the input terminal of the third N-type TFT 203. The fourth N-type TFT set 204 includes a plurality of N-type TFTs 2044 connected in parallel. Each N-type TFT 2044 has a source coupled to an input terminal of the fourth N-type TFT set 204, and a drain coupled to an output terminal of the fourth N-type TFT set 204. Note that in this embodiment, the source of the N-type TFT 2044 is regarded as a first terminal of said N-type TFT 2044, and the drain of the N-type TFT 2044 is regarded as a second terminal of said N-type TFT 2044. The second output terminal 208 is coupled to the output terminal of the fourth N-type TFT set 204. The second input terminal 206 is coupled to the input terminal of the fourth N-type TFT set 204. Note that each of the first N-type TFT set 201, the second N-type TFT set 202, the third N-type TFT set 203, and the fourth N-type TFT set 204 includes a same number of N-type TFTs.

Note that in the embodiment illustrated in FIG. 2, a gate of each N-type TFT 2011 of the first N-type TFT set 201 is coupled to a gate of each N-type TFT 2044 in a one-by-one correspondence, and is coupled to a corresponding one of a plurality of signal output terminals Bi(1), Bi(2), ..., Bi(n) of a first gate terminal 210. Assume both the first N-type TFT set 201 and the fourth TFT set 204 include n TFTs, where n is a positive integer. Similarly, a gate of each N-type TFT 2033 of the third N-type TFT set 203 is coupled to a gate of each N-type TFT 2022 of the second N-type TFT set 202 in a one-by-one correspondence, and is coupled to a corresponding one of a plurality of signal output terminals XBi(1), XBi(2), ..., XBi(n) of a second gate terminal 209. Note that both the second N-type TFT set 202 and the third N-type TFT set 203 include n TFTs.

Figure 3:
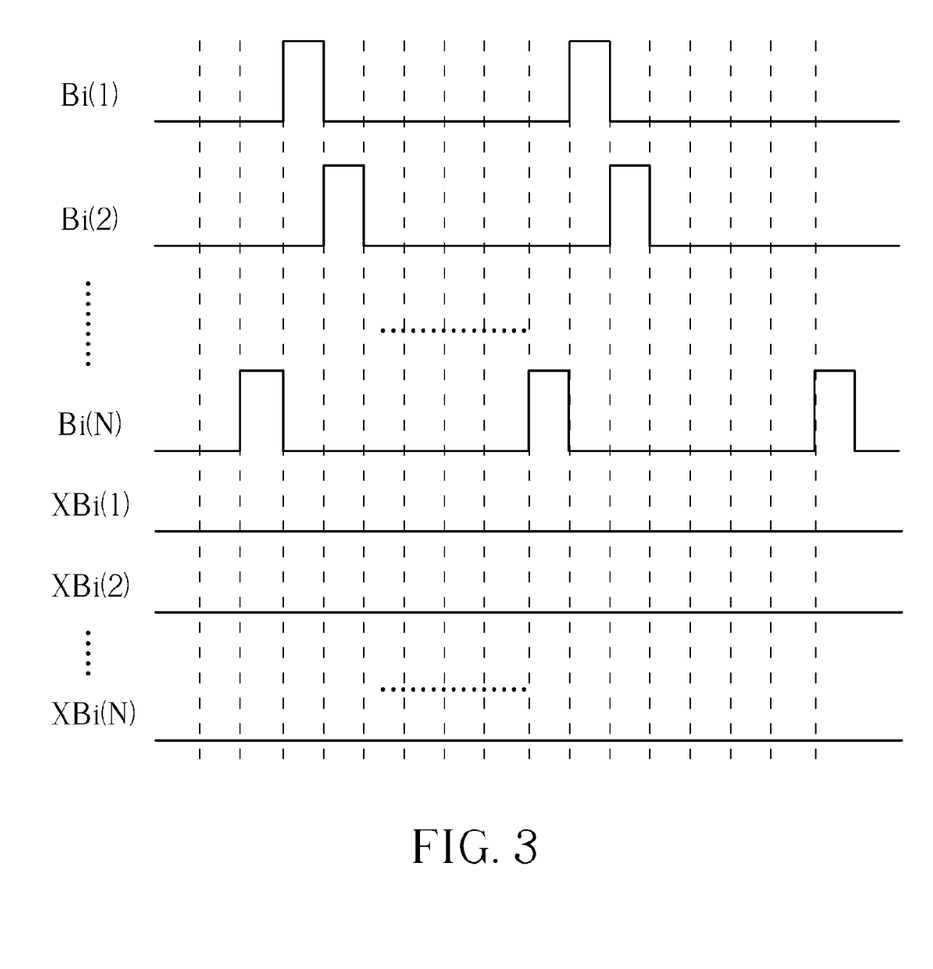
FIG. 3 and FIG. 4 illustrate signal-controlling pulses of the bidirectional controlling device shown in FIG. 2.
Figure 4:
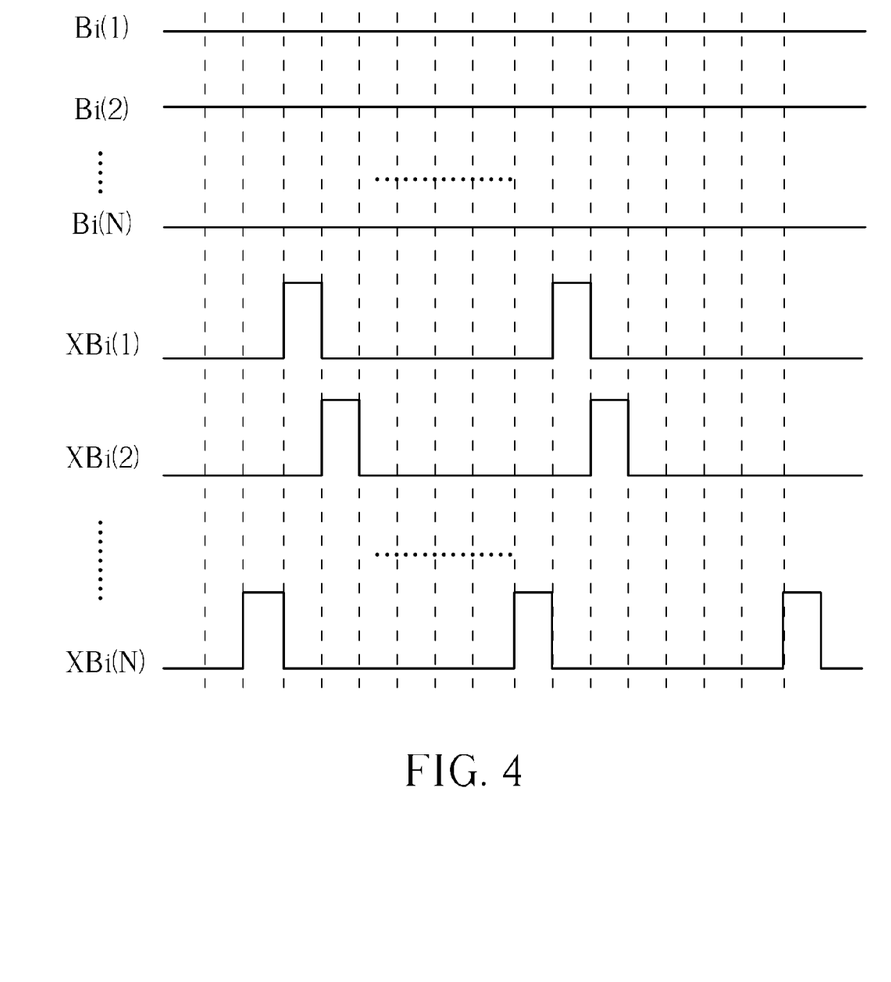

Referring to FIGS. 3 and 4, both illustrate signal pulses of the bidirectional controlling device 200 shown in FIG. 2. As shown in FIG. 3 and FIG. 4, voltage levels received by terminals Bi(1), Bi(2), ..., Bi(n) of the first gate terminal 210 are mutually-exclusive with voltage levels received by the terminals XBi(1), XBi(2), ..., XBi(n) of the second gate terminal 209. As shown in FIG. 3, within a same period, when a gate of a certain N-type TFT 2011 of the first TFT set 201 receives a high voltage level, gates of N-type TFTS 2011 other than said certain TFT 2011 receive a low voltage level. In other words, within a same period, there is merely one TFT 2011 receiving a high voltage level within the first TFT set 201. Similarly, at a same period, there is merely one N-type TFT 2044 receiving a high voltage level within the fourth TFT set 204. Besides, as shown in FIG. 4, in a same period, there is merely one N-type TFT 2022 receiving a high voltage level within the second N-type TFT set 202. And similarly, in a same period, there is merely one N-type TFT 2033 receiving a high voltage level within the third N-type TFT set 203.

As shown in FIG. 2 and FIG. 3, when there is any N-type TFT 2011 receiving a high voltage level within the first N-type TFT set 201, gates of all N-type TFTs 2022 of the second N-type TFT set 202 receive a low voltage level. Similarly, as can be observed from FIG. 2 and FIG. 4, when there is any N-type TFT 2022 receiving a high voltage level within the second N-type TFT set 202, gates of all N-type TFTs 2011 within the first N-type TFT set 201 receive a low voltage level. Similarly, the operations of both the third N-type TFT set 203 and the fourth N-type TFT 204 are the same as those of both the first N-type TFT set 201 and the second N-type TFT set 202.

Figure 5:
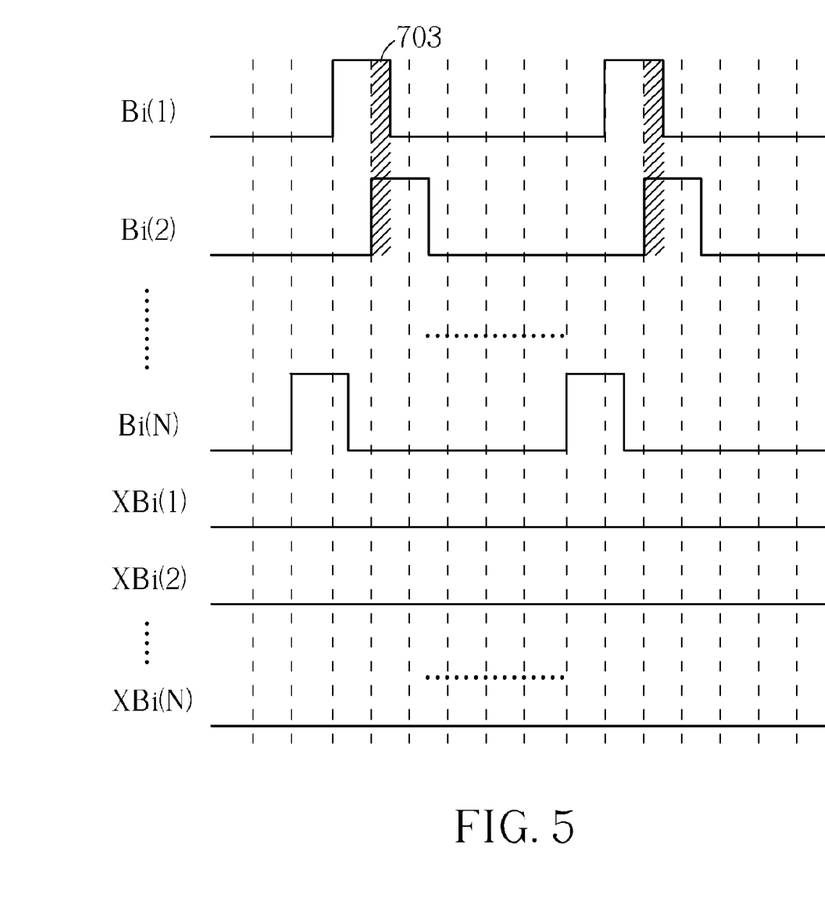
FIG. 5 illustrates signal-controlling pulses after considering delay times in FIG. 3.
Figure 6:
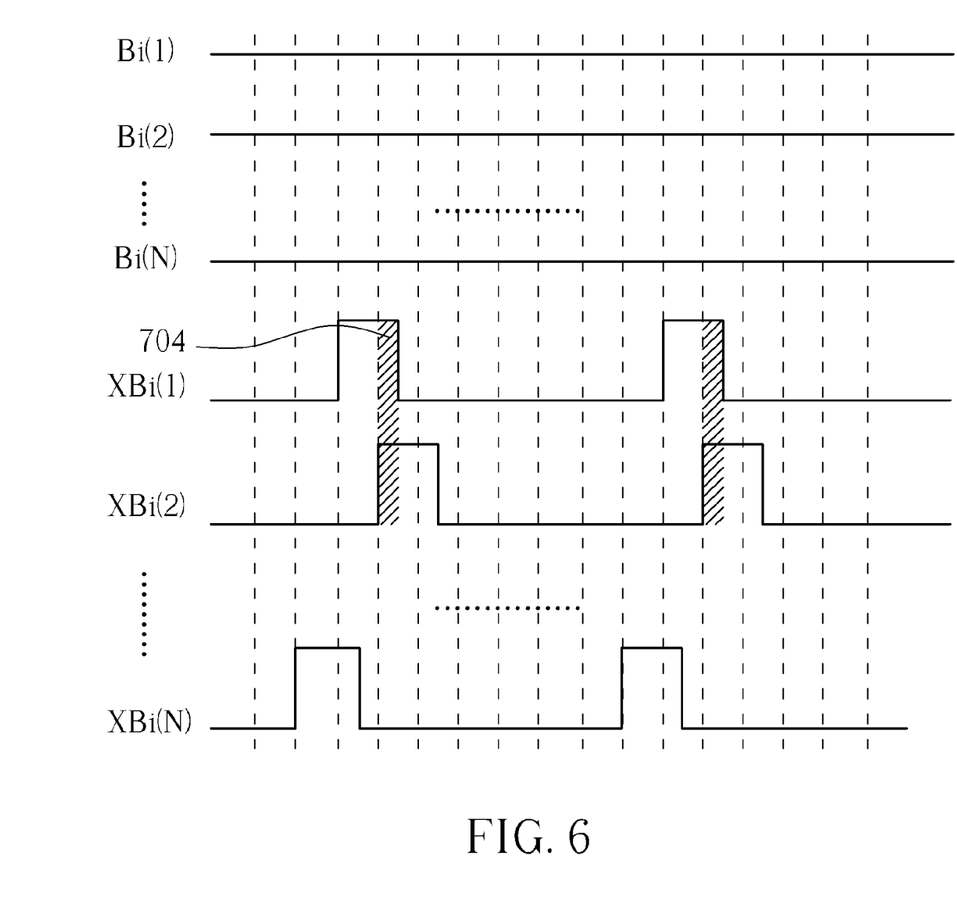
FIG. 6 also illustrates signal-controlling pulses after considering delay times in FIG. 4.

Refer to FIG. 5 and FIG. 6. FIG. 5 illustrates signal pulses after considering delay times in FIG. 3. FIG. 6 also illustrates signal pulses after considering delay times in FIG. 4. Since there are delay times in signal propagation of practical circuits, for stabilizing the practical circuit, in certain preferred embodiments of the present invention, one voltage-alternating time difference between two consecutive periods is assumed to exist. As illustrated in FIG. 5, a region 703 indicates a voltage-alternating time difference while the terminals Bi(1) and Bi(2) receive a high voltage level. Within the voltage-alternating time difference, the abovementioned condition, in which there is merely one N-type TFT 2011 or 2044 receiving a high voltage level within the first or fourth N-type TFT set 201 or 204, fails temporarily for taking the delay times in the practical circuit into consideration. Similarly, in FIG. 6, a region 704 also indicates a voltage-alternating time difference; the condition, in which there is merely one N-type TFT 2022 or 2033 receiving a high-voltage level within the second or third N-type TFT set 202 or 203, also fails temporarily.

With the described bidirectional and alternative controlling mechanism in FIG. 2, FIG. 3, FIG. 4, FIG. 5, and FIG. 6, the DC signal carried by a single TFT in the prior art is replaced by AC signals carried by a plurality of TFTs connected in parallel. And therefore, each TFT is not damaged by rapid shifts in its threshold voltage caused by the DC voltage stress so that a life cycle of each the TFT is thereby lengthened.

Figure 7:
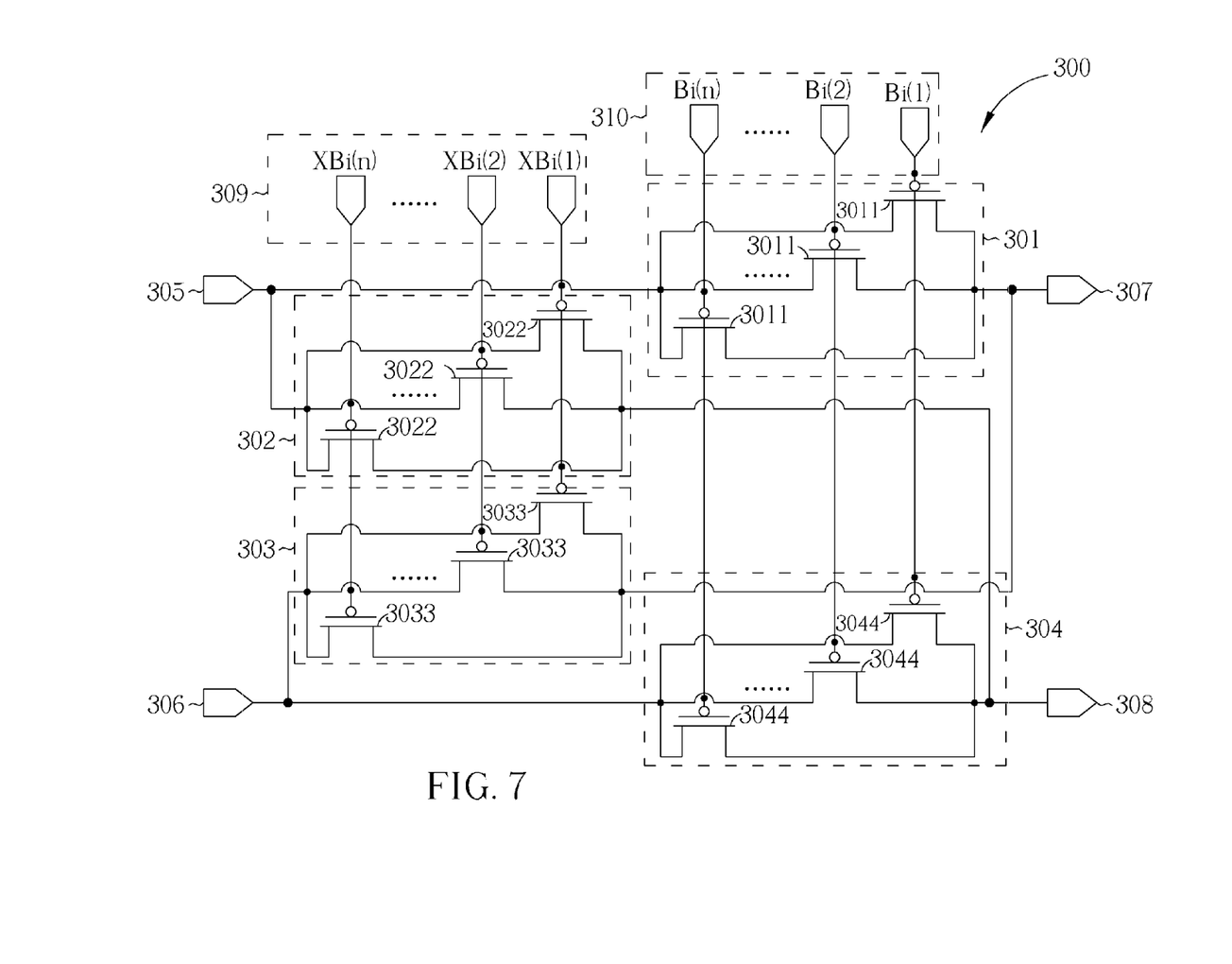
FIG. 7 illustrates a bidirectional controlling device implemented with P-type TFTs, according to one embodiment of the present invention.

Referring to FIG. 7, there is illustrated a bidirectional controlling device implemented with P-type TFTs in the present invention. Note that the P-type TFTs in the bidirectional controlling device illustrated in FIG. 7 function as switches. A bidirectional controlling device 300 includes a first P-type TFT set 301, a second P-type TFT set 302, a third P-type TFT set 303, and a fourth P-type TFT set 304. The first P-type TFT set 301 includes a plurality of P-type TFTs 3011 connected in parallel. The second P-type TFT set 302 includes a plurality of P-type TFTs 3022 connected in parallel. The third P-type TFT set 303 includes a plurality of P-type TFTs 3033 connected in parallel. The fourth P-type TFT 304 includes a plurality of P-type TFTs 3044 connected in parallel. The first input terminal 305 is coupled to both input terminals of the first P-type TFT set 301 and the second P-type TFT set 302. The second input terminal 306 is coupled to both input terminals of the third P-type TFT 303 set and the fourth P-type TFT set 304. The first output terminal 307 is coupled to both output terminals of the first P-type TFT set 301 and the third P-type TFT set 303. The second output terminal 308 is coupled to both output terminals of the second P-type TFT set 302 and the fourth P-type TFT set 304. The first gate terminal 310 includes a plurality of signal output terminals Bi(1), Bi(2), ..., Bi(n). The second gate terminal 309 includes a plurality of signal output terminals XBi(1), XBi(2), ..., XBi(n). Note that in this embodiment, drains of the P-type TFT 3011, 3022, 3033, and 3044 are respectively regarded as first terminals of said P-type TFT 3011, 3022, 3033, and 3044; sources of the P-type TFT 3011, 3022, 3033, and 3044 are respectively regarded as second terminals of said P-type TFT 3011, 3022, 3033, and 3044. A difference between embodiments shown in FIG. 2 and FIG. 7 merely lies in a type of used TFTs. Elements and couplings shown in FIG. 7 are the same as those shown in FIG. 2 so that the elements and the couplings in FIG. 7 are not described further.

Figure 8:
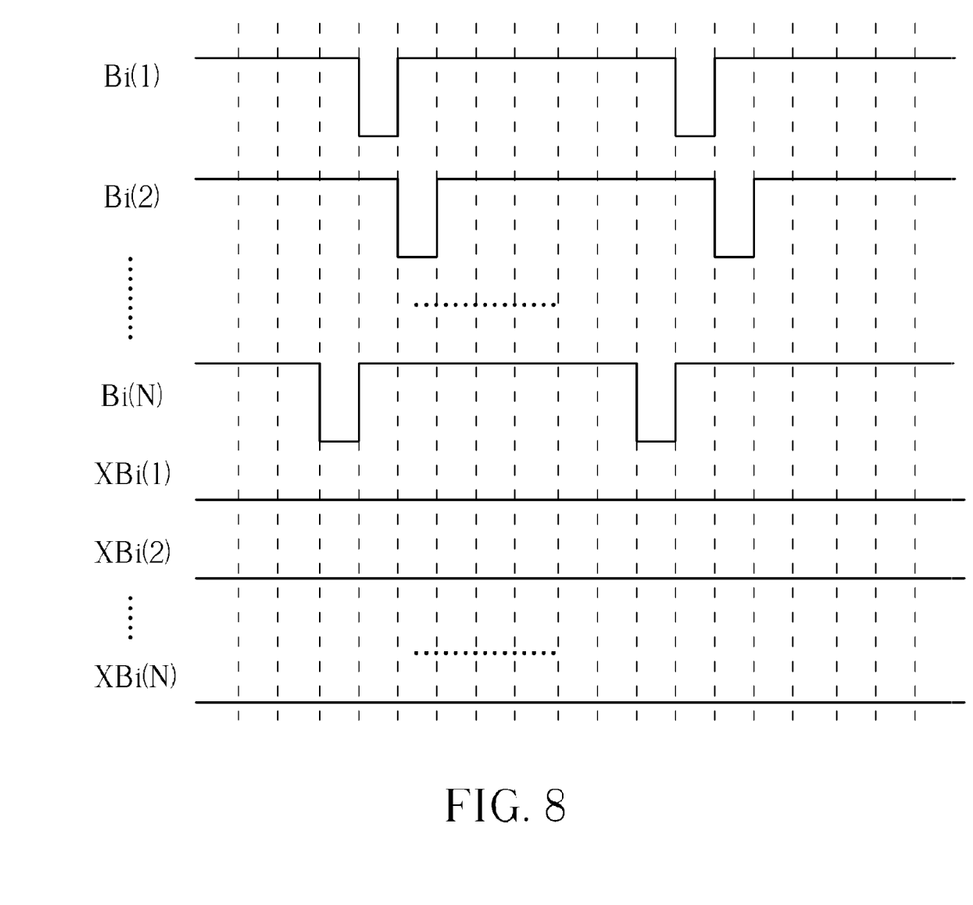
FIG. 8 and FIG. 9 illustrate signal-controlling pulses of the bidirectional controlling device shown in FIG. 7.
Figure 9:
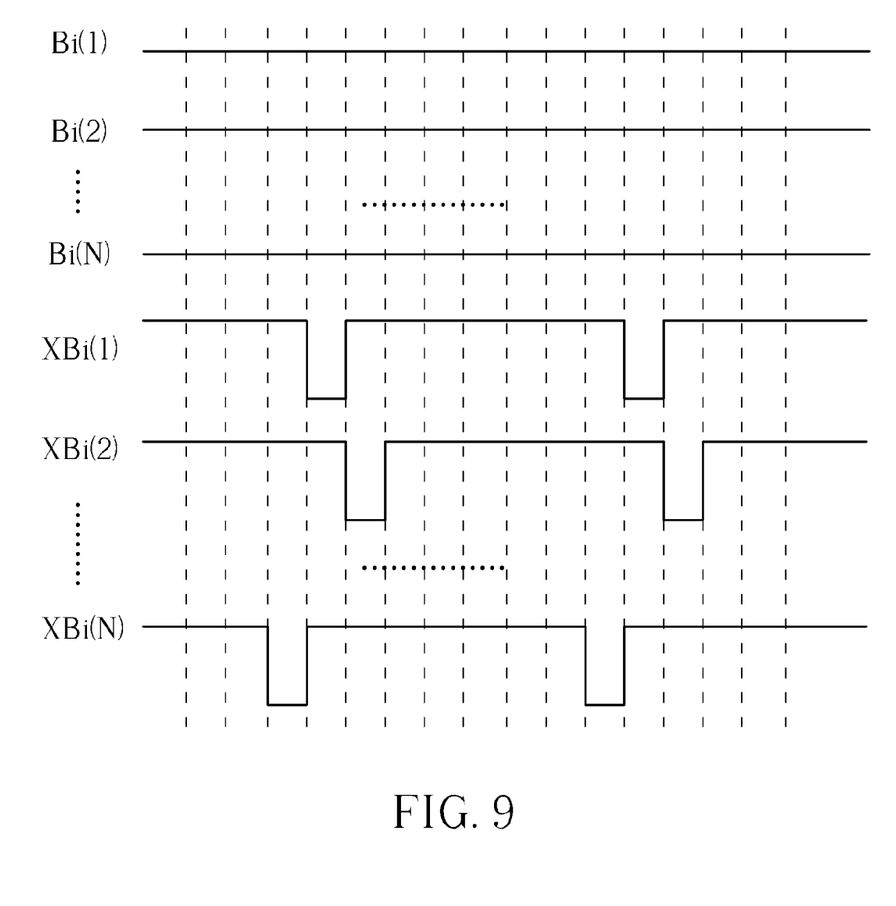

Referring to FIGS. 8 and 9, both illustrate signal-controlling pulses of the bidirectional controlling device 300 shown in FIG. 7. As shown in FIG. 7 and FIG. 8, voltage levels received by the plurality of signal output terminals Bi(1), Bi(2), ..., Bi(n) of the first gate terminal 310 are mutually-exclusive with voltage levels received by the plurality of signal output terminals XBi(1), XBi(2), ..., XBi(n) of the second gate terminal 309.

As shown in FIG. 8, in a same period, merely one from the plurality of terminals Bi(1), Bi(2), ..., Bi(n) of the first gate terminal 310 receives a low voltage level whereas others from said plurality of terminals Bi(1), Bi(2), ..., Bi(n) receive a high voltage level. Moreover, when any signal output terminal of the first gate terminal 310 receives a low voltage level, all signal output terminals of the second gate terminal 309 receives a high voltage level. Similarly, as can be observed from FIG. 7 and FIG. 9, when any signal output terminal of the second gate terminal 309 receives a low voltage level, all signal output terminals of the first gate terminal 310 receive a high voltage level.

Figure 10:
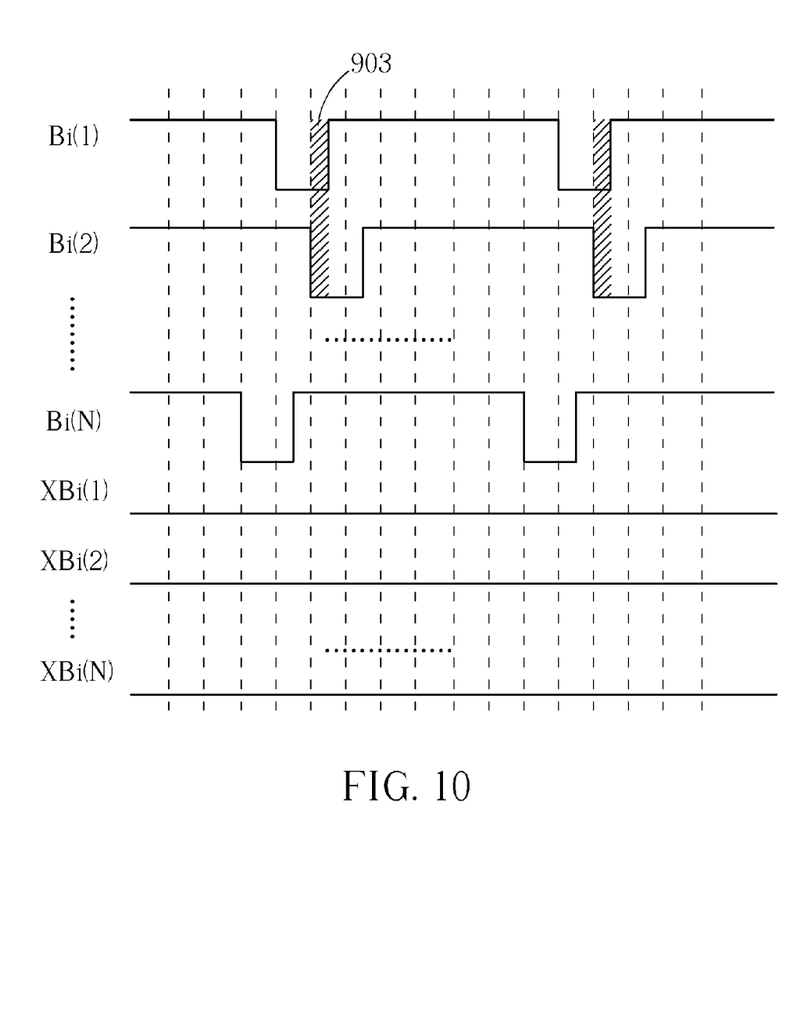
FIG. 10 illustrates signal-controlling pulses after considering delay times in FIG. 8.
Figure 11:
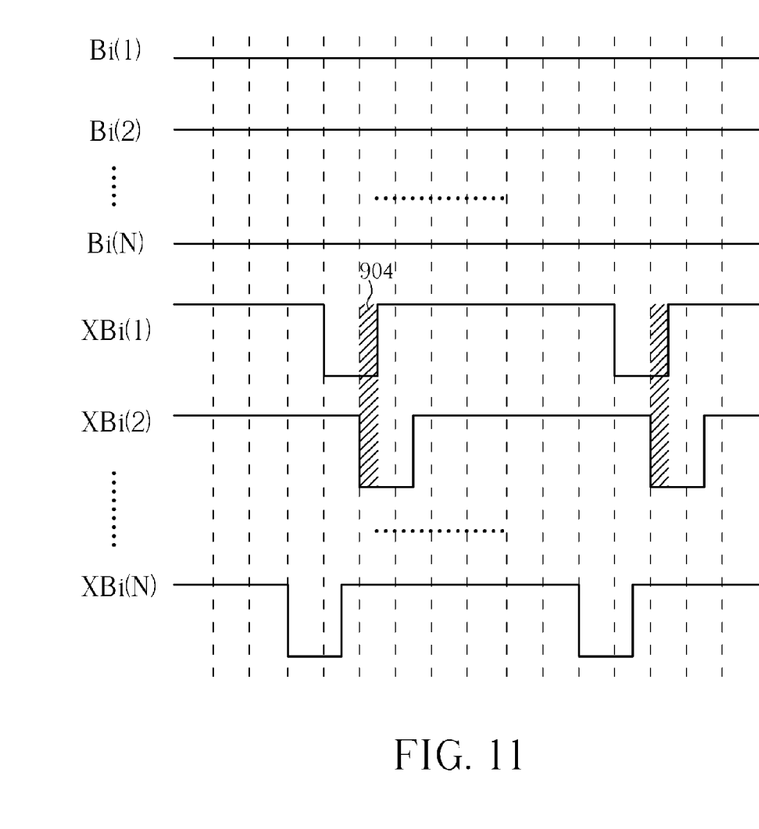
FIG. 11 illustrates signal-controlling pulses after considering delay times in FIG. 9.

Referring to FIGS. 7 and 10, FIG. 10 illustrates signal-controlling pulses after considering delay times in FIG. 8. By considering the abovementioned delay times in signal propagation within practical circuits, in certain preferred embodiments of the present invention, there is also a voltage-alternating time difference between two consecutive periods. As shown in FIG. 10, because of the delay times in the practical circuits, within an overlapped duration of both the signal output terminals Bi(1) and Bi(2) receiving a low voltage level, a region 903 indicates a corresponding voltage-alternating time difference. Within the voltage-alternating time difference, the condition, in which there is merely one P-type TFT 3011 or 3044 receiving a low voltage level within the P-type TFT set 301 or 304 in a same period, fails temporarily because of the existence of the delay times. FIG. 11 illustrates signal-controlling pulses after considering delay times in FIG. 9. Similarly, in FIG. 11, a region 904 also indicates a voltage-alternating time difference. Within the voltage-alternating time difference, the condition, in which there is merely one P-type TFT 3022 or 3033 receiving a low voltage level within the P-type TFT set 302 or 303 in a same period, fails temporarily as well.

As described above, with the aid of the abovementioned bidirectional controlling signals, the DC signal carried by a single TFT in the prior art is replaced by AC signals carried by a plurality of TFTs connected in parallel. And therefore, each TFT is not damaged by rapid shifts in its threshold voltage caused by the DC voltage stress so that a life cycle of each the TFT is thereby lengthened.

Figure 12:
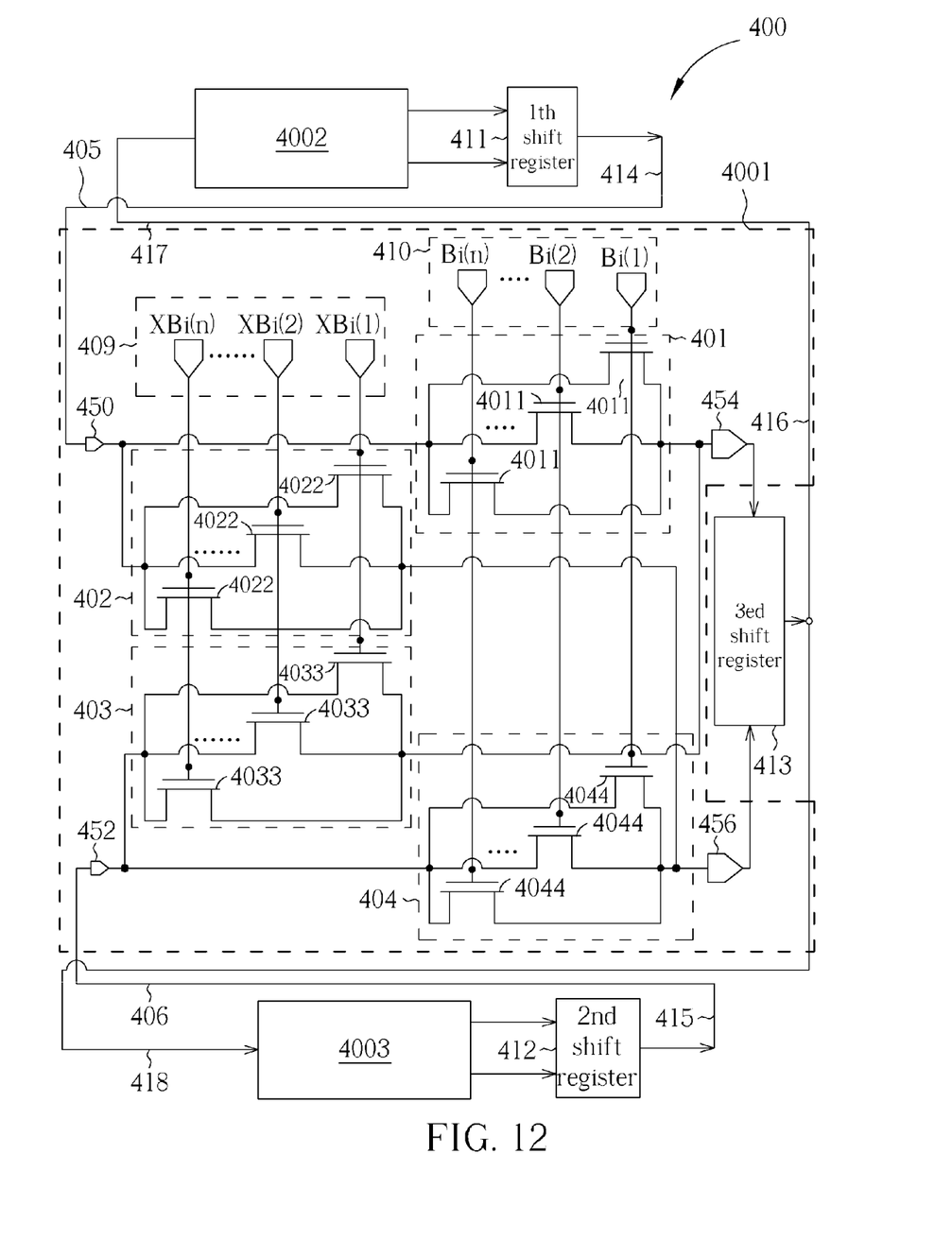
FIG. 12 illustrates a bidirectional controlling device set generated by applying the bidirectional controlling device shown in FIG. 2 on shift registers.

Referring to FIG. 12, there is illustrated a bidirectional controlling device set 400 generated by applying the bidirectional controlling device 200 shown in FIG. 2 on shift registers. The bidirectional controlling device set 400 includes a plurality of bidirectional controlling devices arranged as a matrix on a display. Each bidirectional controlling device of the bidirectional controlling device set 400 is implemented by the bidirectional controlling device 200 shown in FIG. 2. For simplifying descriptions about applying the bidirectional controlling device disclosed in the present invention on shift registers, in FIG. 12, merely three bidirectional controlling devices 4001, 4002, and 4003 are illustrated, and merely operations and a structure of the bidirectional controlling device 4001 is described since operations and structures of both the bidirectional devices 4002 and 4003 are the same with those of the bidirectional controlling device 4001. Besides, the bidirectional devices 4001, 4002, and 4003 are respectively applied on different shift registers. In other words, embodiments formed by using different numbers of bidirectional controlling devices 200 in the bidirectional controlling device set 400 should not be limitations to the present invention. The bidirectional controlling device 4001 is utilized for receiving two input signals respectively provided by a first shift register 411 and a second shift register 412 with the aid of a first signal input source 450 and a second signal input source 452, and for providing two output signals to a third shift register 413 with the aid of a first signal output source 454 and a second signal output source 456. Note that each of the shift registers 411, 412, and 413 has a first input terminal, a second input terminal, and an output terminal. The bidirectional controlling device 4001 includes a first N-type TFT set 401, a second N-type TFT set 402, a third N-type TFT set 403, and a fourth N-type TFT set 404. The first N-type TFT set 401 includes a plurality of N-type TFTs 4011 connected in parallel. Each N-type TFT 4011 has a source coupled to an input terminal of the first N-type TFT set 401, and a drain coupled to an output terminal of the first N-type TFT set 401. The input terminal of the first N-type TFT set 401 is coupled to an output terminal of the first shift register 411 through the first input terminal 450, and the output terminal of the first N-type TFT 401 is coupled to a first input terminal of the third shift register 413 through the first output terminal 454. The second N-type TFT set 402 includes a plurality of N-type TFTs 4022 connected in parallel. Each N-type TFT 4022 has a source coupled to an input terminal of the second N-type TFT set 402, and a drain coupled to an output terminal of the second N-type TFT set 402. The input terminal of the second N-type TFT set 402 is coupled to the output terminal of the first shift register 411 through the first input terminal 450. The output terminal of the second N-type TFT set 402 is coupled to a second input terminal of the third shift register 413 through the second output terminal 456. The third N-type TFT set 403 includes a plurality of N-type TFTs 4033 connected in parallel. Each N-type TFT 4033 has a source coupled to an input terminal of the third N-type TFT set 403, and a drain coupled to an output terminal of the third TFT set 403. The input terminal of the third N-type TFT set 403 is coupled to an output terminal of the second shift register 412 through the second input terminal 452. The output terminal of the third N-type TFT set 403 is coupled to the first input terminal of the third shift register 413 through the first output terminal 454. The fourth N-type TFT set 404 includes a plurality of N-type TFTs 4044 connected in parallel. Each N-type TFT 4044 has a source coupled to an input terminal of the fourth N-type TFT set 404, and a drain coupled to an output terminal of the fourth N-type TFT set 404. The input terminal of the fourth N-type TFT set 404 is coupled to the output terminal of the second shift register 412 through the second input terminal 452. The output terminal of the fourth TFT set 404 is coupled to the second input terminal of the third shift register 413 through the second output terminal 456. Note that each of the first N-type TFT set 401, the second N-type TFT set 402, the third N-type TFT set 403, and the fourth N-type TFT set 404 includes a same number of N-type TFTs. Note that the N-type TFT sets in the bidirectional controlling device set 400 illustrated in FIG. 12 function as switch sets.

In the embodiment shown in FIG. 12, a gate of each TFT 4011 of the first N-type TFT set 401 is coupled to both a gate of a corresponding N-type TFT 4044 of the fourth N-type TFT set 404 and a corresponding one among the signal output terminals Bi(1), Bi(2), ..., Bi(n) of the first gate terminal 410 in a one-by-one correspondence. Similarly, a gate of each TFT 4033 of the third N-type TFT set 403 is coupled to both a gate of a corresponding N-type TFT 4022 of the second N-type TFT set 402 and a corresponding one among the signal output terminals XBi(1), XBi(2), ..., XBi(n) of the second gate terminal 409 in a one-by-one correspondence.

Since the bidirectional controlling device 4001 is implemented with the bidirectional controlling device 200 shown in FIG. 2, operations and statuses of the bidirectional controlling device 4001 are the same as those shown in FIG. 3, FIG. 4, FIG. 5, and FIG. 6 so that the operations and statuses of the bidirectional controlling device 4001 are not described further.

Figure 13:
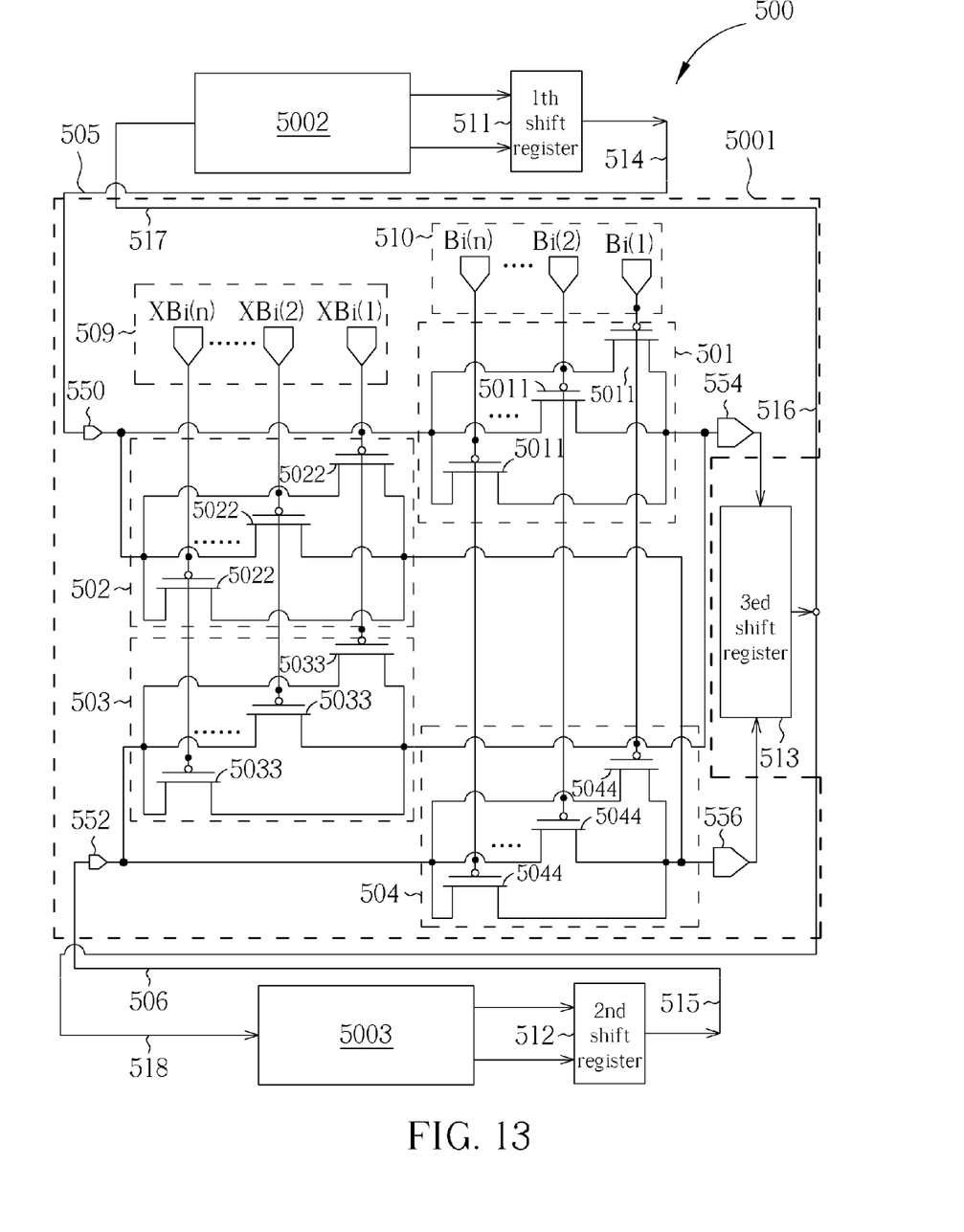
FIG. 13 illustrates a bidirectional controlling device set generated by applying the bidirectional controlling device shown in FIG. 7 on shift registers.

Referring to FIG. 13, there is illustrated a bidirectional controlling device set 500 generated by applying the bidirectional controlling device 300 shown in FIG. 7 on shift registers in the present invention. The bidirectional controlling device set 500, similar with the bidirectional controlling device set 400 shown in FIG. 12, is also applied on a display matrix having a large amount of shift registers, and includes a plurality of bidirectional controlling devices implemented with P-type TFTs. In other words, each bidirectional controlling device of the bidirectional controlling device set 500 is implemented with the bidirectional controlling device 300 shown in FIG. 7. It indicates the fact that a difference between the bidirectional controlling device sets 400 and 500 lies in a type of utilized TFTs. Therefore, merely elements of the bidirectional controlling device set 500 are disclosed herein, whereas operations and repeated couplings of the elements are not described further. The bidirectional controlling device set 500 includes bidirectional controlling device 5001, 5002, and 5003. The bidirectional controlling device 5001 includes a first P-type TFT set 501, a second P-type TFT set 502, a third P-type TFT set 503, and a fourth P-type TFT set 504. The first P-type TFT set 501 includes a plurality of P-type TFTs 5011 connected in parallel. The second P-type TFT set 502 includes a plurality of P-type TFTs 5022 connected in parallel. The third P-type TFT set 503 includes a plurality of P-type TFTs 5033 connected in parallel. The fourth P-type TFT set 504 includes a plurality of P-type TFTs 5044 connected in parallel. The bidirectional controlling device 5001 is used for controlling the first shift register 511, the second shift register 512, and the third shift register 513 through a first signal input source 550, a second signal input source 552, a first signal output source 554, and a second signal output source 556, where the related controlling mechanism is the same with descriptions of FIG. 8, FIG. 9, FIG. 10, and FIG. 11 so that said related controlling mechanism is not described further. Note that the P-type TFT sets in the bidirectional controlling device set 500 illustrated in FIG. 13 function as switch sets.

Note that in the abovementioned embodiments of the present invention, TFTs or TFT sets are utilized in bidirectional controlling devices or bidirectional controlling devices sets as switches or switch sets; however, other elements, which can also be implemented as switches and are other than TFTs, may also be utilized in the abovementioned embodiments of the present invention. In other words, replacing the elements other than TFTs for implementing switches in the embodiments of the present invention should not be limitations to the present invention.

With the aid of the disclosed bidirectional controlling devices and the disclosed bidirectional controlling device sets having the disclosed bidirectional controlling devices applied on shift registers, the DC signal carried by a single element in the prior art is replaced by AC signals carried by a plurality of elements connected in parallel. And therefore, each element is not damaged by rapid shifts in its threshold voltage caused by the DC voltage stress, and is raised in its resistance on voltage stress so that a life cycle of each the element is thereby lengthened. In other words, even if required TFTs are fabricated with a-Si, with the aid of the bidirectional controlling device disclosed in the present invention, a required bidirectional controlling mechanism still operates normally and smoothly.

Those skilled in the art will readily observe that numerous modifications and alterations of the device and method may be made while retaining the teachings of the invention.

What is claimed is:

1. A bidirectional controlling device for receiving input signals from a first input terminal and a second input terminal, and for providing two output signals to a first output terminal and a second output terminal, the bidirectional controlling device comprising:
   a first switch set comprising a plurality of switches each switch comprising a thin-film transistor (TFT) of a same conductivity type connected in parallel, the first switch set having an input terminal coupled to the first input terminal and an output terminal coupled to the first output terminal;
   a second switch set comprising a plurality of switches each switch comprising a TFT of the same conductivity type connected in parallel, the second switch set having an input terminal coupled to the first input terminal and an output terminal coupled to the second output terminal;
   a third switch set comprising a plurality of switches each switch comprising a TFT of the same conductivity type connected in parallel, the third switch set having an input terminal coupled to the second input terminal and an output terminal coupled to the first output terminal; and
   a fourth switch set comprising a plurality of switches each switch comprising a TFT of the same conductivity type connected in parallel, the fourth switch set having an input terminal coupled to the second input terminal and an output terminal coupled to the second output terminal;
   wherein each of the first switch set, the second switch set, the third switch set, and the fourth switch set comprises a same number of switches coupled such that when one switch of a plurality of switches receives a high voltage level, all other switches of said plurality of switches other than said one switch receives a low voltage level.

2. The bidirectional controlling device of claim 1 wherein gates of the plurality of switches of the first switch set are coupled to gates of the plurality of switches of the fourth switch set in a one-by-one correspondence.

3. The bidirectional controlling device of claim 1 wherein gates of the plurality of switches of the second switch set are coupled to gates of the plurality of switches of the third switch set in a one-by-one correspondence.

4. The bidirectional controlling device of claim 1 wherein each switch of the switch sets is an N-type TFT.

5. The bidirectional controlling device of claim 4 wherein a source of each TFT of the first switch set is coupled to the input terminal of the first switch set, and a drain of each TFT of the first switch set is coupled to the output terminal of the first switch set.

6. The bidirectional controlling device of claim 4 wherein a source of each TFT of the second switch set is coupled to the input terminal of the second switch set, and a drain of each TFT of the second switch set is coupled to the output terminal of the second switch set.

7. The bidirectional controlling device of claim 4 wherein a source of each TFT of the third switch set is coupled to the input terminal of the third switch set, and a drain of each TFT of the third switch set is coupled to the output terminal of the third switch set.

8. The bidirectional controlling device of claim 4 wherein a source of each TFT of the fourth switch set is coupled to the input terminal of the fourth switch set, and a drain of each TFT of the fourth switch set is coupled to the output terminal of the fourth switch set.

9. The bidirectional controlling device of claim 1 wherein each switch of the switch sets is a P-type TFT.

10. The bidirectional controlling device of claim 9 wherein a drain of each TFT of the first switch set is coupled to the input terminal of the first switch set, and a source of each TFT of the first switch set is coupled to the output terminal of the first switch set.

11. The bidirectional controlling device of claim 9 wherein a drain of each TFT of the second switch set is coupled to the input terminal of each TFT of the second switch set, and a source of each TFT of the second switch set is coupled to the output terminal of the second switch set.

12. The bidirectional controlling device of claim 9 wherein a drain of each TFT of the third switch set is coupled to the input terminal of the third switch set, and a source of each TFT of the third switch set is coupled to the output terminal of the third switch set.

13. The bidirectional controlling device of claim 9 wherein a drain of each TFT of the fourth switch set is coupled to the input terminal of the fourth switch set, and a source of each TFT of the fourth switch set is coupled to the output terminal of the fourth switch set.

14. A bidirectional controlling device utilized for shift registers, the bidirectional controlling device comprising:
   a first shift register, a second shift register, and a third shift register, each of which having a first input terminal, a second input terminal, and an output terminal;
   a first switch set comprising a plurality of switches each switch comprising a thin-film transistor (TFT) of a same conductivity type connected in parallel, the first switch set having an input terminal coupled to the output terminal of the first shift register and an output terminal coupled to the first input terminal of the third shift register;
   a second switch set comprising a plurality of switches each switch comprising a TFT of the same conductivity type connected in parallel, the second switch set having an input terminal coupled to the output terminal of the first shift register and an output terminal coupled to the second input terminal of the third shift register;
   a third switch set comprising a plurality of switches each switch comprising a TFT of the same conductivity type connected in parallel, the third switch set having an input terminal coupled to the output terminal of the second shift register and an output terminal coupled to the first input terminal of the third shift register; and
   a fourth switch set comprising a plurality of switches each switch comprising a TFT of the same conductivity type connected in parallel, the fourth switch set having an input terminal coupled to the output terminal of the second shift register and an output terminal coupled to the second input terminal coupled to the third shift register;
   wherein each of the first switch set, the second switch set, the third switch set, and the fourth switch set comprises a same number of switches coupled such that when one switch of a plurality of switches receives a high voltage level, all other switches of said plurality of switches other than said one switch receives a low voltage level.

* * * * *